Oct. 10, 1961 W. H. DREXEL 3,004,196

APPARATUS FOR COOLING SEMICONDUCTOR DEVICES

Filed April 11, 1960 2 Sheets-Sheet 1

INVENTOR
WERNER H. DREXEL
BY [signature]
ATTORNEY

INVENTOR
WERNER H. DREXEL
BY
Henry Huff
ATTORNEY 3,004,196

APPARATUS FOR COOLING SEMICONDUCTOR DEVICES

Werner H. Drexel, Jackson Heights, N.Y., assignor to Sperry Rand Corporation, Great Neck, N.Y., a corporation of Delaware Filed Apr. 11, 1960, Ser. No. 21,160
2 Claims. (Cl. 317—234)

Figure 1:
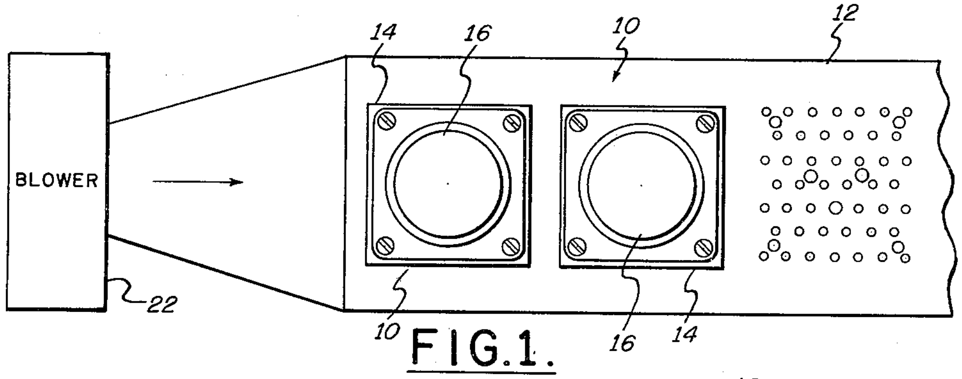

This invention relates generally to cooling equipment and more particularly to apparatus for cooling semiconductor devices.

Semiconductor devices such as transistors have performance characteristics that vary with changes in temperature and, therefore, require that their operating temperatures be stabilized. Temperature stabilization is customarily achieved by cooling the devices to a temperature at which their performance characteristics are optimum. This is usually done by mounting the devices to be cooled on a metallic duct having cooling fins therein and passing a coolant, e.g. air, through the duct past the fins. However, because most power transistors have their collector electrodes electrically connected to their transistor casings, electrical insulation between the transistors mounted on the duct is necessary. This electrical insulation is usually provided by the insertion of a thin insulating washer between each transistor and the duct. However, since electrical insulators are also good thermal insulators, the washers hinder the cooling of the transistors.

The present invention overcomes this disadvantage by utilizing individual transistor coolers, hereafter called heat sinks, for the transistors and electrically insulating the heat sinks from each other. Each heat sink has a flat plate portion, to which a transistor is directly secured, and a plurality of pins extending perpendicularly from one side of the flat plate. Both the plate portion and pins have high thermal conductivity. In a preferred form of the invention, the individual heat sinks are secured to an electrically nonconductive duct, with the pins of the heat sinks extending into the duct through holes in the duct. An electrically nonconductive coolant flowing through the duct cools the heat sinks, and therefore the transistors, by removing heat from the fins.

The use of pins by the present invention, itself has advantages over the prior art use of fins. Between any surface and a cooling fluid flowing thereby, a thermally poor conductive film exists, the thickness of the film being in inverse relationship to the ease of heat conduction across this film. The heat transfer term given to the ease of heat conduction across the film is the convection coefficient. The convection coefficient in turn is a function of the cooling fluid velocity and heat sink geometry. With a given amount of heat sink material, i.e. fin or pin material, the heat transfer rate away from a transistor by conduction will be approximately the same for a given form factor. However, the heat transfer rate, by convection, away from the surface in contact with the cooling fluid, will generally be greater with pins than with fins, because the pins cause a greater convection coefficient. This in part is due to local turbulence in the cooling fluid near the hot surface. This turbulence decreases the thickness of the above-mentioned film, thereby increasing the convection heat transfer rate. Still using a given amount of heat sink material, the cooling rate afforded a transistor may be augmented further by increasing the number of cooling elements, i.e. the number of pins, by decreasing the thickness of the pins. This has the effect of exponentially increasing the surface area in contact with the cooling fluid. In addition, thin pins themselves cause greater local fluid turbulence than thick pins. Less apparent than either the relationship of the heat transfer rate with fins versus the heat transfer rate with pins, or the effect of pin diameter on the heat transfer rate, is the effect of the coolant flow rate on the heat transfer rate with pins and fins. Generally, the heat transfer rate increases with increased coolant flow rate. A plot on logarithmic scales of the heat transfer rate with fin-type apparatus versus coolant flow rate produces a straight line over the laminar flow region, whereas a plot on the same scales of the heat transfer rate with pin-type apparatus versus coolant flow rate produces an exponentially shaped curve. The two plots, when superimposed on each other, show that the heat transfer advantage of pin-type apparatus over fin-type apparatus increases exponentially as the coolant flow rate increases or decreases away from a critical flow rate. The present invention makes use of this phenomenon by employing extremely low coolant flow rates. At very low coolant flow rates, the advantage of pin-type apparatus is a maximum. That is, fin-type apparatus, to have equivalent heat transfer rates, would have to employ very much higher coolant flow rates. This last discussed feature is particularly important where the invention is to be employed in airborne apparatus. In airborne apparatus, the cooling of semiconductor devices is a critical problem and the use of small, light-weight blowers (which inherently are low flow rate devices) is desirable.

Hence, optimum transistor cooling apparatus may be provided by, (1) mounting each transistor to be cooled directly against its own heat sink and insulating each heat sink from other heat sinks, (2) providing each heat sink with as many staggered cooling pins as possible, the pins being as thin as possible, and (3) directing a coolant past the pins at as low a flow rate as will effectively cool the transistors.

The principal object of the invention is to provide efficient, lightweight apparatus for cooling semiconductor devices.

Figure 2:
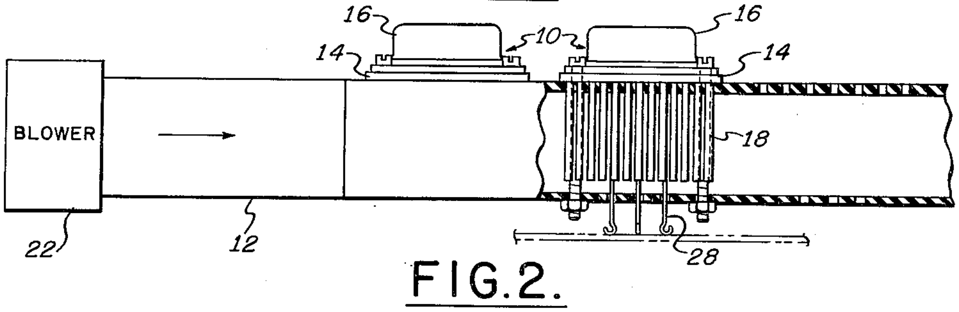
Figures 3, 4:
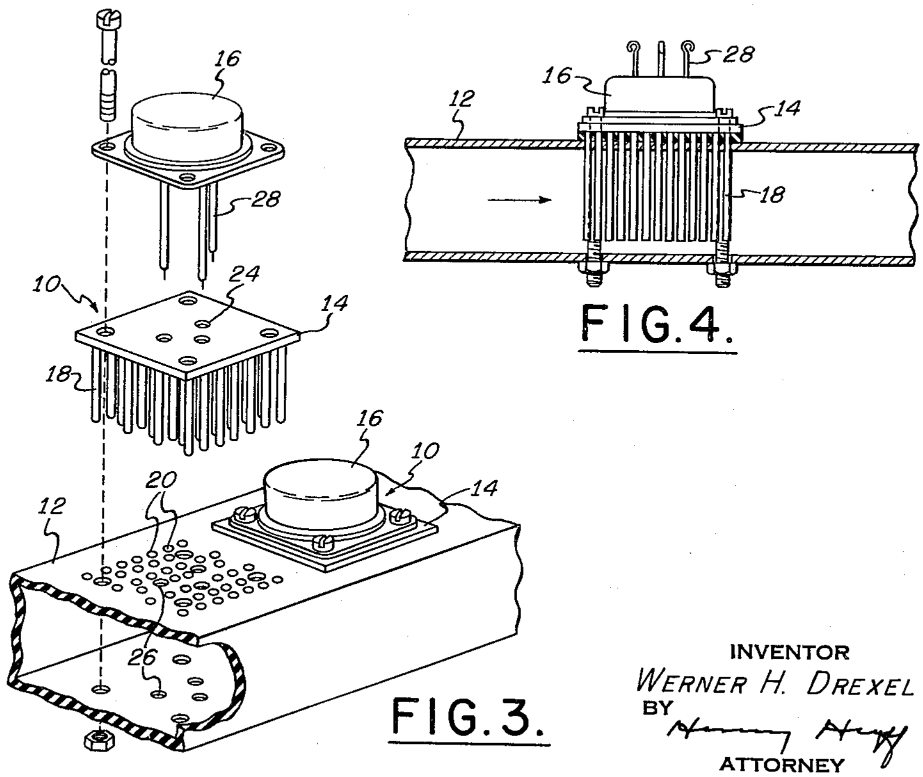
Figure 5:
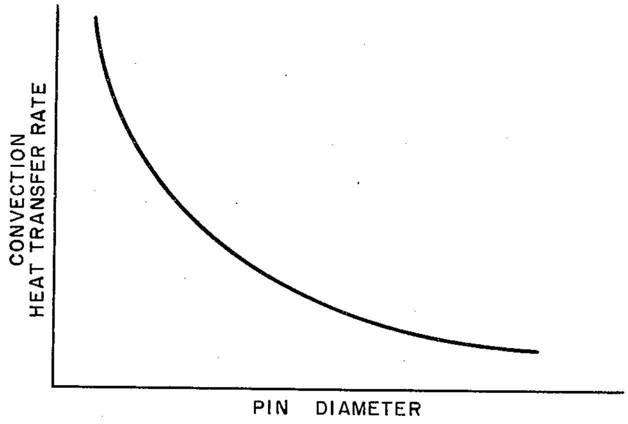
Figure 6:
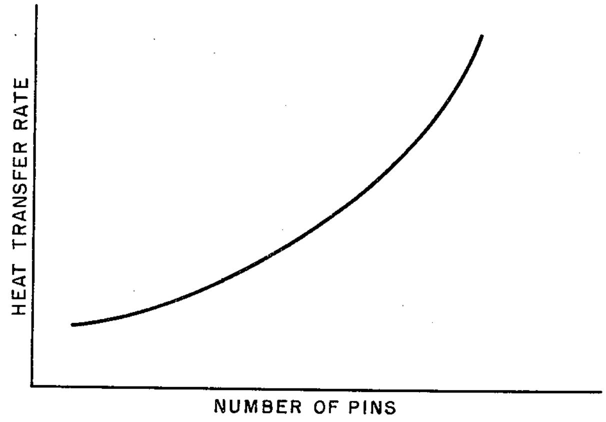
Figure 7:
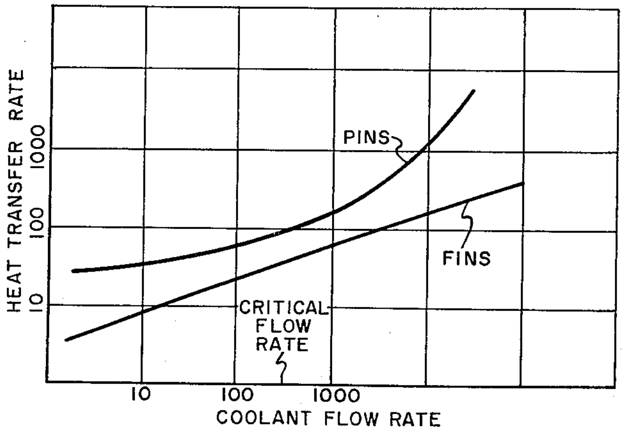

The invention will be described with reference to the figures wherein,

FIG. 1 is a plan view of apparatus embodying the invention,

FIG. 2 is a side view of the apparatus shown in FIG. 1, said view being partialy cutaway, FIG. 3 is a perspective view of the embodiment shown in FIG. 1, FIG. 4 is a side view of another embodiment of the invention, FIG. 5 shows the relationship between pin diameter and the heat transfer rate by convection, FIG. 6 shows the effect on the heat transfer rate when the number of cooling pins is increased, and FIG. 7 shows the relationship between the heat transfer rate and the coolant flow rate for both pin-type and fin-type apparatus.

Referring to FIGS. 1–3, thermally conductive heat sinks 10 are mounted on an electrically nonconductive duct 12. Each heat sink 10 has a flat plate 14 against which a transistor 16 is held in direct contact. Pins 18 (as many as practical) extend from the flat plate 14, are integral with same, and are preferably arranged on the plate in rows, with no two adjacent rows in alignment. Each pin 18 is also preferably cylindrical, with a diameter that is (as shown) substantially smaller than one quarter of its length; in fact, it is desirable to make the pin diameters as small as practical. The duct 12 is provided with holes 20 through which the pins 18 extend to the interior of the duct. A blower 22 connects to the input end of the duct 12 and directs a stream of air through the duct. Holes 24 and 26, through which the transistor lead wires 28 may be brought for electrical connections, are provided respectively in the plate 14 and the duct 12. Transistors which do not have lead wires emanating from the side of the transistor which abuts against the heat sink do not require holes to be provided in the heat sinks and duct. These transistors are mounted as shown in FIG. 4.

The staggering of the pins 18 is for the purpose of increasing the turbulence (and therefore the heat transfer by convection) of air flowing past the pins. The pins 18 have diameters as small as practical to further effect high convection heat transfer rates. See FIG. 5. Pins having small diameters are more inclined to swirl the air flowing by them than pins having larger diameters. This increased swirling of the air further reduces the thickness of the poor-conduction film (resulting from low air turbulence). The density of the pins 18 on the plate 14 is preferably made as great as possible to take advantage of the exponential increase in the convection heat transfer rate with a linear increase in the number of pins utilized. See FIG. 6. FIGS. 5 and 6 complement each other and together show that, with a given amount of material, maximum transfer results when the pins are made as thin as possible (thereby increasing the number of pins). FIGS. 5 and 6 were plotted while holding the transistor heat dissipation and the coolant flow rates constant. FIG. 7 illustrates the exponentially increasing advantage of pin-type apparatus over fin-type apparatus as the air flow rate is increased and decreased away from a critical value. The critical value of air flow is that value at which the advantage of pin-type heat sinks over fin-type heat sinks is a minimum. A heat sink cooling rate obtainable by a pin-type heat sink with a particular air flow rate is only obtainable by a fin-type heat sink with a much higher air flow rate.

In operation, air is passed through the duct 12 by the blower 22. The air, in weaving through the staggered pins 18, cools the heat sinks, and the transistors affixed to them, by removing heat from the pins 18. Whereas the transistors are not thermally insulated from the heat sinks, they are, nevertheless, electrically insulated from each other by the duct.

The invention may be practiced with an electrically conductive duct by simply inserting a thin electrical insulator between the duct and each heat sink 10. Also, if preferred, a single large hole may be provided for each heat sink instead of a plurality of pin holes. In this case, all pins on a particular heat sink would extend into the duct through the same hole.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. Apparatus for cooling a plurality of transistors the bases of which must be insulated from each other comprising a nonconductive duct, a plurality of heat sinks each of which comprises a plate upon which a transistor is adapted to be mounted and a plurality of cylindrical pins in contiguous relationship with said plate, each of said pins being solid and having a diameter substantially smaller than one quarter of its length, said heat sink pins and plates being thermally conductive and said duct being adapted to have said heat sinks mounted thereon with their respective pins extending into the interior of said duct, and means for blowing air through said duct and past said pins at a rate that is below the critical flow rate for air, whereby heat is removed convectively from said pins.

2. Apparatus for cooling a plurality of transistors the bases of which must be insulated from each other comprising a nonconductive duct, a plurality of heat sinks each of which comprises a plate upon which a transistor is adapted to be mounted and a plurality of cylindrical pins contiguously secured to said plate and arranged in staggered rows, each of said pins being solid and having a diameter substantially smaller than one quarter of its length, said heat sink pins and plates being thermally conductive and said duct being adapted to have said heat sinks mounted thereon with their respective pins extending into the interior of said duct, and means for blowing air through said duct and past said pins at a rate that is below the critical flow rate for air, whereby heat is removed convectively from said pins.

References Cited in the file of this patent

UNITED STATES PATENTS

| | | |
|---|---|---|
| 2,780,757 | Thornhill et al. | Feb. 5, 1957 |
| 2,783,418 | Peter et al. | Feb. 26, 1957 |
| 2,942,165 | Jackson et al. | June 21, 1960 |